(12) United States Patent
Torai

(10) Patent No.: US 12,181,529 B2
(45) Date of Patent: Dec. 31, 2024

(54) LEARNING APPARATUS, ESTIMATION APPARATUS, LEARNING METHOD, ESTIMATION METHOD, RECORDING MEDIUM HAVING RECORDED THEREON LEARNING PROGRAM, AND RECORDING MEDIUM HAVING RECORDED THEREON ESTIMATION PROGRAM

(71) Applicant: Yokogawa Electric Corporation, Tokyo (JP)

(72) Inventor: Soichiro Torai, Tokyo (JP)

(73) Assignee: Yokogawa Electric Corporation, Tokyo (JP)

(*) Notice: Subject to any disclaimer, the term of this patent is extended or adjusted under 35 U.S.C. 154(b) by 623 days.

(21) Appl. No.: 17/359,638

(22) Filed: Jun. 28, 2021

(65) Prior Publication Data

US 2021/0325469 A1 Oct. 21, 2021

Related U.S. Application Data

(63) Continuation of application No. PCT/JP2019/041167, filed on Oct. 18, 2019.

(30) Foreign Application Priority Data

Dec. 28, 2018 (JP) .................................. 2018-247207

(51) Int. Cl.
*G06F 11/30* (2006.01)
*G01R 31/367* (2019.01)
(Continued)

(52) U.S. Cl.
CPC ....... *G01R 31/367* (2019.01); *G01R 31/3842* (2019.01); *G06N 3/088* (2013.01);
(Continued)

(58) Field of Classification Search
CPC .................................................... G01R 31/367
See application file for complete search history.

(56) References Cited

U.S. PATENT DOCUMENTS

2003/0184307 A1 10/2003 Kozlowski
2004/0207367 A1 10/2004 Taniguchi
(Continued)

FOREIGN PATENT DOCUMENTS

CN 103091642 A 5/2013
CN 107273445 A 10/2017
(Continued)

OTHER PUBLICATIONS

International Preliminary Report on Patentability for International Application No. PCT/JP2019/041167, issued by the International Bureau of WIPO on Jun. 16, 2021.
(Continued)

*Primary Examiner* — Phuong Huynh

(57) ABSTRACT

A learning apparatus is provided, which comprises: a characteristic acquisition unit for acquiring one of a voltage and a capacity of a storage battery and a characteristic corresponding to a capacity change and a voltage change of the storage battery under a plurality of conditions during at least one of charging and discharging of the storage battery; and a learning unit for learning a relationship between one of the voltage and the capacity of the storage battery and the characteristic under each of the plurality of conditions to generate an estimation model for estimating at least one of a maximum capacity and a remaining capacity of the storage battery from one of the voltage and the capacity of the storage battery and the characteristic.

18 Claims, 11 Drawing Sheets

(51) Int. Cl.
  *G01R 31/3842* (2019.01)
  *G06N 3/088* (2023.01)
  *H01M 10/44* (2006.01)
  *H01M 10/48* (2006.01)
  *H02J 7/00* (2006.01)

(52) U.S. Cl.
  CPC ........... *H01M 10/44* (2013.01); *H01M 10/48* (2013.01); *H02J 7/0047* (2013.01); *H01M 2220/20* (2013.01)

(56) References Cited

U.S. PATENT DOCUMENTS

2017/0294689 A1* 10/2017 Wada ..................... H02J 7/0049
2017/0363690 A1   12/2017 Kawamura
2018/0095140 A1*  4/2018 Park ..................... G01R 31/367

FOREIGN PATENT DOCUMENTS

| CN | 107526038 A | * | 12/2017 | ........... G01R 31/367 |
|---|---|---|---|---|
| JP | H09236641 A | | 9/1997 | |
| JP | H09243716 A | | 9/1997 | |
| JP | 2016014588 A | | 1/2016 | |
| JP | 2016053564 A | | 4/2016 | |
| JP | 2017223537 A | | 12/2017 | |
| JP | 2017227539 A | | 12/2017 | |

OTHER PUBLICATIONS

Soichiro Torai et al., "State-of-health estimation of LifePO4/graphite batteries based on a model using differential capacity," Journal of Power Sources 306(2016).

Ho-Ta Lin et al., "Estimation of Battery State of Health Using Probabilistic Neural Network," IEEE Transactions on Industrial Informaics, vol. 9, No. 2, May 2013.

Extended European Search Report for European Patent Application No. 19902756.6, issued by the European Patent Office on Jan. 28, 2022.

Office Action issued for counterpart Chinese Application 201980086400.X, issued by The State Intellectual Property Office of People's Republic of China on Jan. 11, 2024.

T. Furukawa et al., "Modular network self-organizing map: Can it be an artificial cortex?", International Congress Series 1301 (2007), p. 43-p. 47.

* cited by examiner

LEARNING APPARATUS, ESTIMATION APPARATUS, LEARNING METHOD, ESTIMATION METHOD, RECORDING MEDIUM HAVING RECORDED THEREON LEARNING PROGRAM, AND RECORDING MEDIUM HAVING RECORDED THEREON ESTIMATION PROGRAM

The contents of the following Japanese patent application are incorporated herein by reference:
NO. 2018-247207 filed in JP on Dec. 28, 2018
NO. PCT/JP2019/041167 filed in WO on Oct. 18, 2019

BACKGROUND

1. Technical Field

The present invention relates to a learning apparatus, an estimation apparatus, a learning method, an estimation method, a recording medium having recorded thereon a learning program, and a recording medium having recorded thereon an estimation program.

2. Related Art

Conventionally, technology for estimating the state of a storage battery using a model based on various parameters associated with the phase-transition behavior of the $LiFePO_4$ and graphite materials (for example, refer to Non-Patent Document 1) and technology for estimating the state of a storage battery using a probabilistic neural network (for example, refer to Non-Patent Document 2) are known.

PRIOR ART DOCUMENT

Non-Patent Document

[Non-Patent Document 1] Soichiro Torai et al., "State-of-health estimation of $LiFePO_4$/graphite batteries based on a model using differential capacity," Journal of Power Sources 306(2016).
[Non-Patent Document 2] Ho-Ta Lin et al., "Estimation of Battery State of Health Using Probabilistic Neural Network," IEEE TRANSACTIONS ON INDUSTRIAL INFORMAICS, VOL. 9, NO. 2, May, 2013.

Technical Problem

According to the technology described in Non-Patent Document 1, since a modeling is performed at a material level of the battery, detailed information of battery materials is needed, and with many existing parameters, the computational load is high. Also, according to technology described in Non-Patent Document 2, in order to generate the model, considerable time and cost are required. However, it is desired to easily estimate the state of the storage battery from data of storage battery in operation.

GENERAL DISCLOSURE

In order to solve the above-mentioned problem, a first aspect of the present invention provides a learning apparatus. The learning apparatus may comprise a characteristic acquisition unit for acquiring one of a voltage and a capacity of a storage battery under a plurality of conditions and a characteristic corresponding to a capacity change and a voltage change of the storage battery during at least one of charging and discharging of the storage battery. The learning apparatus may comprise a learning unit for learning a relationship between one of a voltage and a capacity of the storage battery and the characteristic under each of the plurality of conditions to generate an estimation model for estimating at least one of a maximum capacity and a remaining capacity of the storage battery from one of the voltage and the capacity of the storage battery and the characteristic.

The learning unit may generate the estimation model by interpolating a relationship under a different condition from the relationship under at least one condition of the plurality of conditions.

The learning unit may use a modular network Self Organizing Map, wherein a module is a neural network, to generate the estimation model.

The characteristic may be a differential capacity characteristic calculated by differentiating a capacity of the storage battery by a voltage.

The learning unit may associate a maximum capacity of the storage battery with each condition individually.

The learning unit may calculate a maximum capacity of the storage battery to associate with each condition based on an integration characteristic calculated by integrating the differential capacity characteristic by a voltage of the storage battery.

The characteristic may be a differential voltage characteristic calculated by differentiating a voltage of the storage battery by a capacity.

A second aspect of the present invention provides an estimation apparatus. The estimation apparatus may comprise a model acquisition unit for acquiring an estimation model for estimating at least one of a maximum capacity and a remaining capacity of a storage battery from the relationship between one of a voltage and a capacity of the storage battery and the characteristic corresponding to a capacity change and a voltage change of the storage battery under a plurality of conditions during at least one of charging and discharging of the storage battery. The estimation apparatus may comprise a data acquisition unit for acquiring a time series data regarding a voltage and a current of the storage battery. The estimation apparatus may comprise a calculation unit for calculating the characteristic based on a time series data regarding a voltage and a current of the storage battery. The estimation apparatus may comprise an estimation unit for using the estimation model to estimate at least one of a maximum capacity and a remaining capacity of the storage battery from one of a voltage and a capacity of the storage battery and the calculated characteristic.

The estimation model may be generated by interpolating the relationship under a different condition from the relationship under at least one condition of the plurality of conditions.

The estimation model may be learned using a modular network Self Organizing Map, wherein a module is a neural network.

The characteristic may be a differential capacity characteristic calculated by differentiating a capacity of the storage battery by a voltage.

The estimation unit may estimate a maximum capacity of the storage battery based on an integration characteristic calculated by integrating the differential capacity characteristic by a voltage of the storage battery.

The characteristic may be a differential voltage characteristic calculated by differentiating a voltage of the storage battery by a capacity.

The estimation unit may acquire a model differential voltage characteristic calculated by differentiating a voltage of the storage battery by a capacity from the estimation model to estimate a remaining capacity of the storage battery with reference to the model differential voltage characteristic.

The estimation unit may perform fitting on a partial differential voltage characteristic calculated by differentiating a voltage of the storage battery by a capacity based on a time series data of a voltage and a current of the storage battery with reference to the model differential voltage characteristic to estimate a remaining capacity of the storage battery.

The estimation unit may judge whether it can estimate at least one of a maximum capacity and a remaining capacity of the storage battery based on a time series data of a voltage and a current of the storage battery.

A third aspect of the present invention provides a learning method for learning the learning apparatus. The learning method may comprise acquiring an estimation model for estimating one of a voltage and a capacity of the storage battery under a plurality of conditions and the characteristic corresponding to a capacity change and a voltage change of the storage battery during at least one of charging and discharging of the storage battery. The learning method may comprise learning a relationship between one of a voltage and a capacity of the storage battery and the characteristic under each of the plurality of conditions to generate an estimation model for estimating at least one of a maximum capacity and a remaining capacity of the storage battery from one of a voltage and a capacity of the storage battery and the characteristic.

A fourth aspect of the present invention provides an estimation method for estimation by an estimation apparatus. The estimation method may comprise acquiring an estimation model for estimating at least one of a maximum capacity and a remaining capacity of a storage battery from relationship between one of a voltage and a capacity of the storage battery and the characteristic corresponding to a capacity change and a voltage change of the storage battery under a plurality of conditions during at least one of charging and discharging of the storage battery. The estimation method may comprise acquiring a time series data of a voltage and a current of the storage battery. The estimation method may comprise calculating the characteristic based on a time series data of a voltage and a current of the storage battery. The estimation method may comprise using the estimation model to estimate to estimate at least one of a maximum capacity and a remaining capacity of the storage battery from one of a voltage and a capacity of the storage battery and the calculated characteristic.

A fifth aspect of the present invention provides a recording medium having recorded thereon a learning program. The learning program may be implemented by a computer. The learning program may cause the computer to function as a characteristic acquisition unit for acquiring one of a voltage and a capacity of a storage battery under a plurality of conditions and a characteristic corresponding to a capacity change and a voltage change of the storage battery during at least one of charging and discharging of the storage battery. The learning program may cause the computer to function as a learning unit for learning a relationship between one of a voltage and a capacity of the storage battery and the characteristic under each of the plurality of conditions to generate an estimation model for estimating at least one of a maximum capacity and a remaining capacity of the storage battery from one of a voltage and the capacity of the storage battery and the characteristic.

A sixth aspect of the present invention provides a recording medium having recorded thereon an estimation program. The estimation program may implemented by a computer. The estimation program may cause the computer to function as a model acquisition unit for acquiring an estimation model for estimating at least one of a maximum capacity and a remaining capacity of a storage battery from the relationship between one of a voltage and a capacity of the storage battery and the characteristic under a plurality of conditions corresponding to a capacity change and a voltage change of the storage battery during at least one of charging and discharging of the storage battery. The estimation program may cause the computer to function as a data acquisition unit for acquiring a time series data regarding a voltage and a current of the storage battery. The estimation program may cause the computer to function as a calculation unit for calculating the characteristic based on a time series data regarding a voltage and a current of the storage battery. The estimation program may cause the computer to function as an estimation unit for using the estimation model to estimate at least one of a maximum capacity and a remaining capacity of the storage battery from one of a voltage and a capacity of the storage battery and the calculated characteristic.

Note that, the summary clause does not necessarily describe all necessary features of the embodiments of the present invention. In addition, the present invention may also be a sub-combination of those features described above.

DESCRIPTION OF EXEMPLARY EMBODIMENTS

Hereinafter, the present invention will be described through embodiments of the invention, but the following embodiments do not limit the claimed invention. Also, all combinations of features described in the embodiments are not necessarily essential to solutions of the invention.

Figure 1:
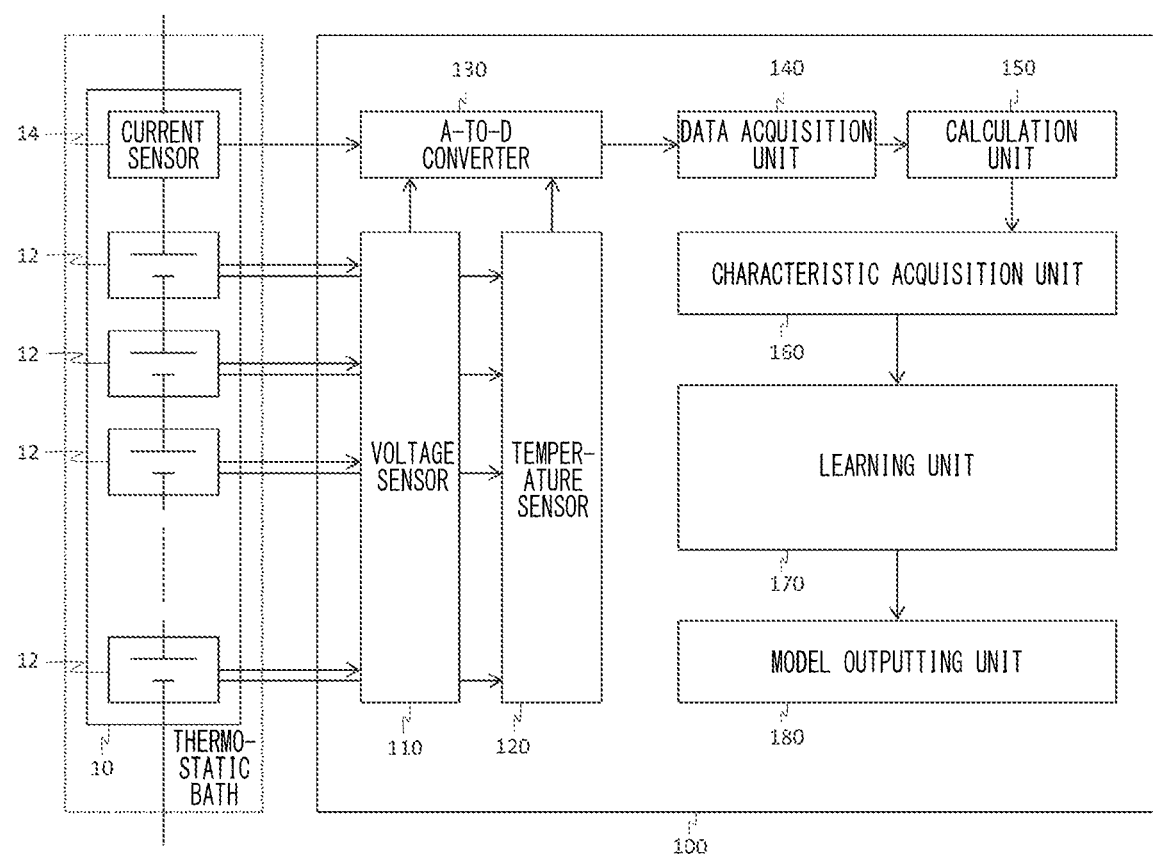
FIG. 1 shows a learning apparatus 100 according to the present embodiment with a storage battery 10.

FIG. 1 shows a learning apparatus 100 according to the present embodiment with a storage battery 10. The learning apparatus 100 according to the present embodiment generates an estimation model for estimating at least one of the maximum capacity and the remaining capacity of the storage battery 10, which is usable repeatedly by charging.

Herein, the maximum capacity is a maximum quantity of electricity [Ah] which can be stored in the storage battery 10 within a defined battery voltage range. Generally, the maximum capacity of the storage battery gradually decreases due to the degradation of the characteristic because of deactivation of an active material for providing electrical conductivity and side reactions as charging and discharging are repeated. The learning apparatus 100 according to the present embodiment generates a model for estimating the maximum capacity of the storage battery 10 which deteriorates due to repeated charging and discharging in this manner.

Additionally, the remaining capacity is the remaining quantity of electricity [Ah], which can be discharged by the storage battery at a present time. The learning apparatus 100 according to the present embodiment generates a model for estimating such a remaining capacity of the storage battery 10. Generally, knowing the maximum capacity and the remaining capacity is extremely important for operating an electric storage system safely and highly efficiently for a long time.

The learning apparatus 100 may be computer, such as a PC (a personal computer), a tablet computer, a smartphone, a workstation, a server computer or a general purpose computer, and may be a computer system to which a plurality of computers is connected. Such a computer system is also a computer in a broad sense. Also, the learning apparatus 100 may be implemented by one or more virtual computer environments in a computer. Alternately, the learning apparatus 100 may be a special purpose computer designed for learning an estimation model, and may be a special purpose hardware realized by a dedicated circuit.

The storage battery 10, which is the learning object of the learning apparatus 100 according to the present embodiment, is for supplying electrical power to a load which is not illustrated in the drawing. Recently, storage batteries have been widely used for vehicles such as hybrid vehicles and electric automobiles, laptops, digital cameras, mobile phones, smartphones and the like. Generally, these storage batteries are configured as battery packs which include battery modules, including a plurality of battery cells, connected in a series-parallel connection. The storage battery 10, which is the learning object of the learning apparatus 100 according to the present embodiment, may be at least one of the battery modules in the battery pack configured in this manner, for example. The storage battery 10 may be operated in a bath such as a thermostatic bath, in which the internal temperature is maintained substantially constant, while the learning apparatus 100 acquires training data for generating an estimation model. The storage battery 10 comprises a plurality of battery cells 12 and a current sensor 14.

Each of the plurality of battery cells 12 is connected in series with each other. The battery cell 12 is one of the configuration units of the battery and also called a single battery. The storage battery 10 obtains a desired output voltage by connecting such battery cells 12 in series.

The current sensor 14 is connected in series with the plurality of battery cells 12 to measure current flowing in a storage battery 10. The current sensor 14 supplies the measured current to the learning apparatus 100.

The learning apparatus 100 according to the present embodiment comprises a voltage sensor 110, a temperature sensor 120, an A-to-D converter 130, a data acquisition unit 140, a calculation unit 150, a characteristic acquisition unit 160, a learning unit 170, and a model outputting unit 180.

The voltage sensor 110 measures an inter-terminal voltage of the storage battery 10, which is a voltage value with the plurality of battery cells 12 all connected in series. Also, the voltage sensor 110 may measure the inter-terminal voltages for each of the plurality of battery cells 12. The voltage sensor 110 supplies the measured voltage to the A-to-D converter 130.

The temperature sensor 120 measures the temperature of the storage battery 10. The temperature sensor 120 uses any point of the plurality of battery cells 12 as a representative point to measure the temperature of the storage battery 10. Also, the temperature sensor 120 may measure a temperature of each of the plurality of battery cells 12. The temperature sensor 120 supplies the measured temperature to the A-to-D converter 130.

The A-to-D converter 130 samples the current measured by the current sensor 14, the voltage measured by the voltage sensor 110 and the temperature measured by the temperature sensor 120 in a predetermined sampling period to convert analog data regarding the sampled measured values to digital data. Then, the A-to-D converter 130 supplies the converted digital data of a voltage V, a current I and a temperature T of the storage battery 10 to the data acquisition unit 140.

The data acquisition unit 140 acquires a time series data regarding the digital data of the voltage V and the current I of the storage battery 10 converted by the A-to-D converter 130. Also, the data acquisition unit 140 acquires the digital data of the temperature T of the storage battery 10 converted by the A-to-D converter 130 with the time series data regarding the voltage V and the current I of the storage battery 10. When the voltage sensor 110 measures the inter-terminal voltages for each of the plurality of battery cells 12, the data acquisition unit 140, for example, may acquire the voltage V of the storage battery 10 from the sum of the inter-terminal voltages for each of the plurality of battery cells 12. Also, when the temperature sensor 120 measures temperatures of each of the plurality of battery cells 12, the data acquisition unit 140, for example, may acquire the temperature T of the storage battery 10 from the statistics (such as the average) of each temperature of the plurality of battery cells 12. Alternately, without using the temperature measured by the temperature sensor 120, the data acquisition unit 140 may acquire the set temperature of the thermostatic bath as the temperature T of the storage battery 10. However, there is a case where the set temperature of the thermostatic bath and the actual surface temperature of the battery cell 12 are different. Accordingly, the actual temperature measured by the temperature sensor 120 is preferable for the temperature T of the storage battery 10.

The calculation unit 150 preprocesses the time series data regarding the voltage V and the current I of the storage battery 10 acquired by the data acquisition unit 140. For example, the calculation unit 150 calculates one of the voltage V and a capacity Q of the storage battery 10 under a plurality of conditions and calculates a characteristic corresponding to a capacity change and a voltage change of the storage battery 10 during at least one of charging and discharging of the storage battery 10 based on the time series data regarding the voltage V and the current I of the storage battery 10. Herein, the characteristic may be a differential capacity characteristic calculated by differentiating the capacity of the storage battery 10 by the voltage. This will be described below.

The characteristic acquisition unit 160 acquires one of the voltage V and a capacity Q of the storage battery 10 under a plurality of conditions and acquires a characteristic corresponding to the capacity change and the voltage change of the storage battery 10 during at least one of charging and discharging of the storage battery 10.

The learning unit 170 learns a relationship between one of the voltage V and the capacity Q of the storage battery 10 under each of the plurality of conditions and the characteristic corresponding to the capacity change and the voltage change of the storage battery 10 to generate the estimation model for estimating at least one of the maximum capacity and the remaining capacity of the storage battery 10 from one of the voltage V and the capacity Q of the storage battery 10 and the characteristic. This will be described below.

The model outputting unit 180 outputs the estimation model learned by the learning unit 170. The model outputting unit 180 supplies the estimation model to another function unit in the learning apparatus. Also, the model outputting unit 180 may supply the estimation model to another apparatus via a network, for example.

Note that, in the above-mentioned description, a case where the learning apparatus 100 comprises the voltage sensor 110, the temperature sensor 120 and the A-to-D converter 130 is described as one example, which is not limited thereto. At least one of the voltage sensor 110, the temperature sensor 120, or the A-to-D converter 130 may be comprised by an apparatus different from the learning apparatus 100.

Figure 2:
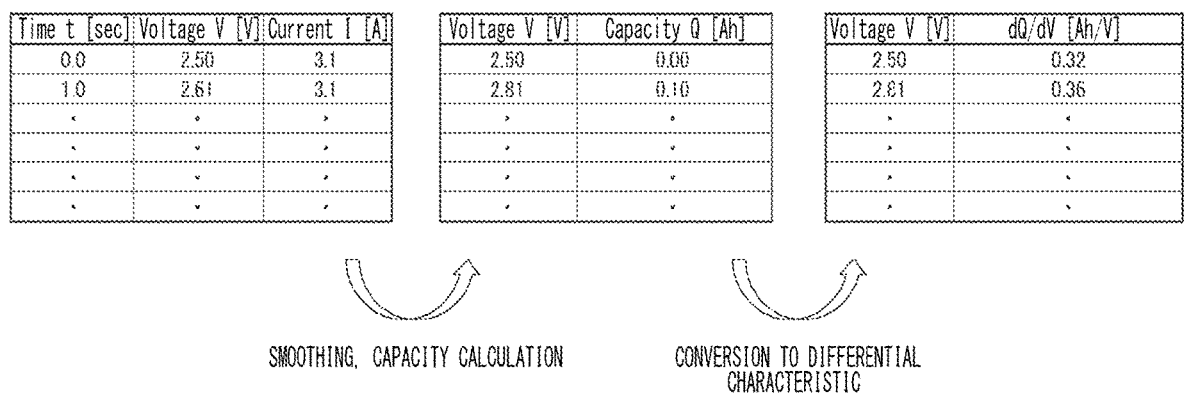
FIG. 2 shows one example of preprocessing data performed by a calculation unit 150 of the learning apparatus 100 according to the present embodiment.

FIG. 2 shows one example of the preprocessing of data performed by the calculation unit 150 of the learning apparatus 100 according to the present embodiment. The data acquisition unit 140 acquires the voltage V and the current I of the storage battery 10 under the plurality of conditions with a time t. Note that, herein, the plurality of conditions refers to conditions comprising the temperature T, a charge/discharge rate and an SOH (State of Health) of the storage battery 10, wherein at least one of them is different. Herein, the charge/discharge rate refers to an amount of currents during charging and discharging per unit of 1C, which is the amount of currents for completely charging the storage battery in one hour. Also, the SOH refers to a percentage of the maximum capacity at a present time to the maximum capacity at the initial time. As one example, the left of this drawing shows the voltage V and the current I of the storage battery 10, with the time t, which are acquired by the data acquisition unit 140 under a condition (the temperature T=xx degree Celsius, the charge/discharge rate=xx C, the SOH=xx %).

The calculation unit 150 performs data smoothing by performing, for example, a sectional average process and a moving average process, for the data acquired by the data acquisition unit 140. Then, the calculation unit 150 multiplies the current I by the time t and add them up as the time t passes to calculate the capacity Q [Ah] as shown in the center of this drawing. Then, the calculation unit 150 differentiates the capacity Q by the voltage V to convert it to a differential capacity characteristic dQ/dV [Ah/V] calculated by differentiating the capacity Q of the storage battery 10 by the voltage V. The calculation unit 150 performs preprocessing on each of the data acquired by the data acquisition unit 140 under each condition to obtain the relationship between the voltage V of the storage battery 10 and the differential capacity characteristic dQ/dV under each condition, as shown in the right of this drawing.

Figure 3:
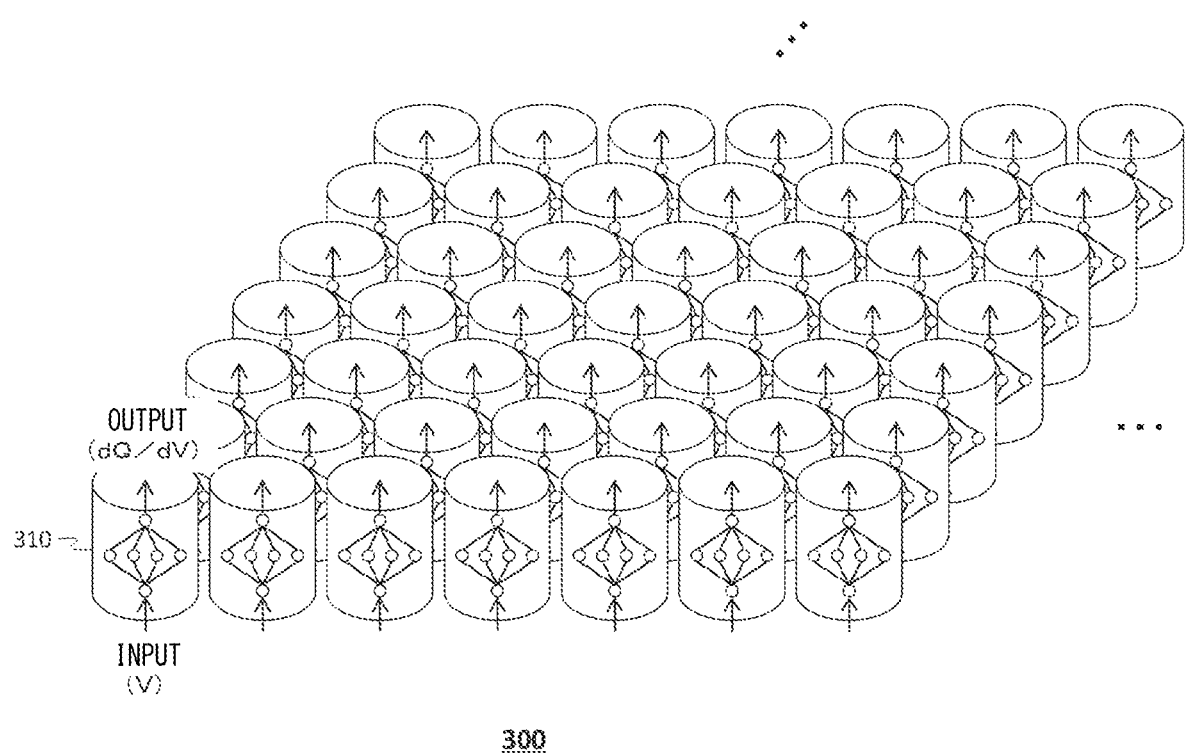
FIG. 3 shows one example of an estimation model 300 generated by the learning apparatus 100 according to the present embodiment.

FIG. 3 shows one example of an estimation model 300 generated by the learning apparatus 100 according to the present embodiment. The learning unit 170 generates an estimation model, which interpolates relationships under different conditions from a relationship under at least one of the plurality of conditions. As one example, the learning unit 170 may generate an estimation model using a modular network Self Organizing Map (mnSOM) wherein the module is a neural network. However, it is not limited thereto. The learning unit 170 may generate an estimation model using other unsupervised learnings including a clustering such as a k-average method, principal component analysis, independent component analysis and the like, and may generate an estimation model using regression including a k-Nearest Neighbor, regression tree, a random forest, a neural network, support vector regression, projection pursuit regression and the like.

SOM (Self Organizing Map) is known as a model which expresses a degree of similarity of given input information by distance on a map. The SOM is comprised of a plurality of units arranged regularly. Each unit has a reference vector in the dimension identical with an input vector. Then, the SOM compares the input vector and the reference vector to convert the input vector to a coordinate on the map of a unit having a reference vector closest to the input vector. That is, the SOM is configured to map the input vector from a vector space where the input vector exists to a map space where the unit is arranged.

The SOM performs self-learning so that the relationship between input vectors in the vector space is maintained in the map space where the input vectors are mapped. That is, the SOM, by unsupervised learning, obtains a homeomorphic mapping from the vector space to the map space. Specifically, when the input vector is given to the SOM, the SOM determines a unit having the reference vector closest to the input vector to be a winning unit. At this time, the unit closer to the winning unit on the map obtains a right to learn more strongly about the input vector, and depending on the strength, learns to make the reference vector closer to the input vector. As for the strength of the learning here, the winning unit is the strongest, and the farther the position on the map is from the winning unit, the poorer the strength of the learning becomes. The SOM can obtain a map where the relationship between input vectors in the vector space is preserved by repeating such an update of the reference vector on a plurality of input vectors.

In this manner, the SOM is an unsupervised learning neural network having a bilayered structure comprising an input layer and an output layer, and it maps the input data to the output layer in an arbitrary dimension by unsupervised learning. That is, the SOM is a model which, by unsupervised learning, maps the input data to the output layer, where the plurality of units, with which the vector in the identical dimension with the input data is associated, are regularly arranged, and is a model which updates the vector being associated with each unit to perform learning.

The mnSOM is a SOM where such a reference vector unit is replaced with a module such as a neural network. The learning unit 170 of the learning apparatus 100 according to the present embodiment generates the estimation model 300 using this mnSOM. The estimation model 300 comprises a plurality of modules 310. In the present embodiment, each module 310 has a single-input, single-output neural network structure of the multilayer perceptron type, and the number of layers, the number of nodes of hidden layers and the activation function of each module 310 may be arbitrary. The learning unit 170 learns each module 310 using a neural net, where the voltage V of the storage battery 10 is the input vector and the differential capacity characteristic dQ/dV is the output vector, to generate the estimation model 300. However, it is not limited thereto. Each module 310 is not necessarily the neural network, and may be a structure which can learn to input the voltage V of the storage battery 10 and output the differential capacity characteristic dQ/dV, such as a linear regression, a k-Nearest Neighbor, a regression tree, a random forest, support vector regression, a decision tree, a Bayesian network, a hidden Markov model.

Figure 4:
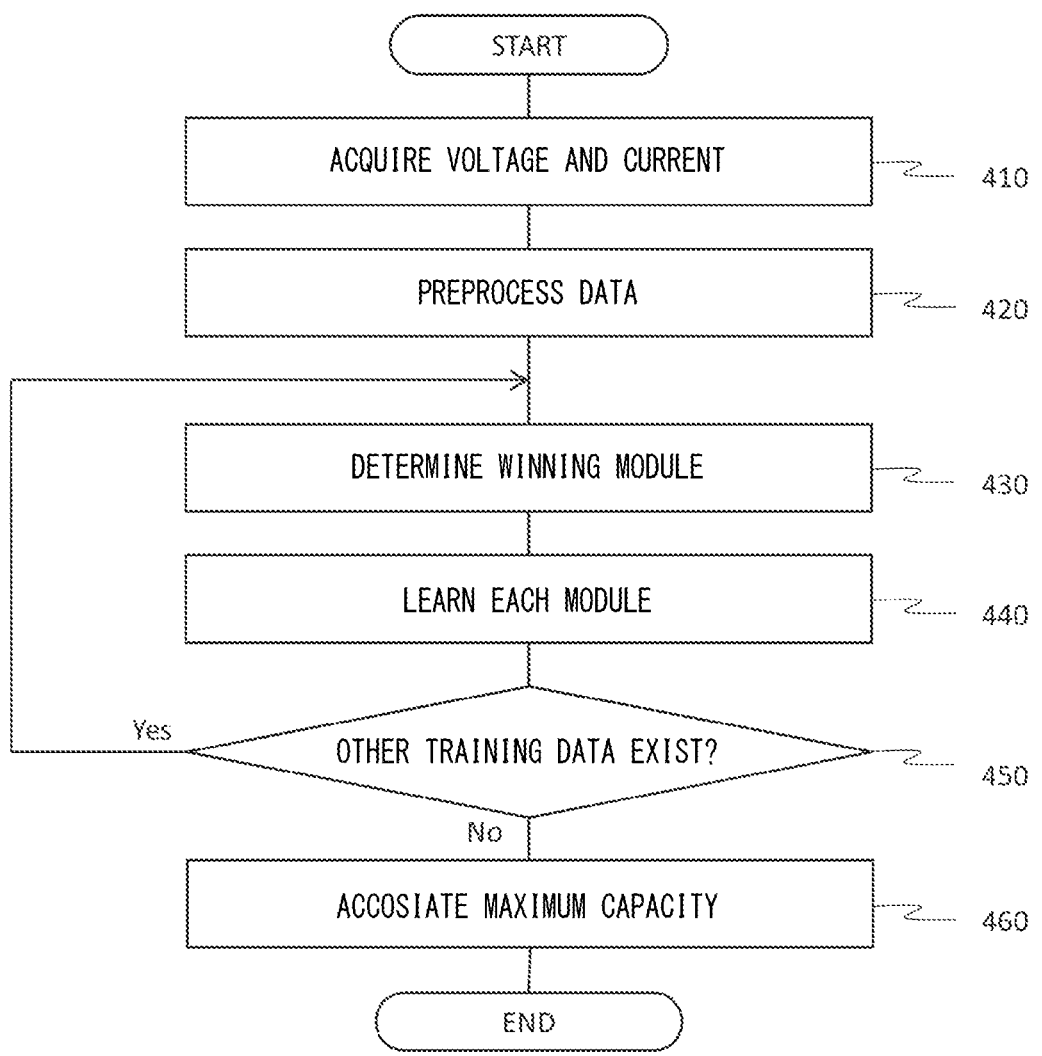
FIG. 4 shows a flow of generating the estimation model 300, by the learning apparatus 100 according to the present embodiment.

FIG. 4 shows a flow of generating the estimation model 300 by the learning apparatus 100 according to the present embodiment. This flow, as one example, describes a case where the learning unit 170 creates one map using training data under a common temperature condition (for example, the temperature T=25 degree Celsius), a common condition of charge/discharge rate (for example, the charge/discharge rate=0.2 C charging) and different SOH conditions (for example, the SOH=64%, 69%, 86%, 92% and 100%). In this case, the learning unit 170 creates another map, which is different from the above-mentioned map, using training data under conditions where at least one of the temperature condition and the condition of charge/discharge rate is different. That is, the learning unit 170 creates a plurality of maps corresponding to each of a plurality of conditions where at least one of the temperature condition and the condition of charge/discharge rate is different. Alternately, the learning unit 170 may create a map using training data under a common condition of charge/discharge rate (for example, the charge/discharge rate=0.2 C), different temperature conditions (the temperature T=25 degree Celsius and 45 degree Celsius) and different SOH conditions (for example, the SOH=64%, 69%, 86%, 92% and 100%). That is, the learning unit 170, for example, may create a map using training data under ten conditions in total, including five conditions where "the temperature T=25 degree Celsius, the charge/discharge rate=0.2 C and the SOH=64%, 69%, 86%, 92% and 100%" and five conditions where "the temperature T=45 degree Celsius, the charge/discharge rate=0.2 C and the SOH=64%, 69%, 86%, 92% and 100%."

In step 410, the data acquisition unit 140 acquires the time series data regarding the voltage V and the current I of the storage battery 10 under different SOH conditions.

In step 420, the calculation unit 150 performs preprocessing on data in accordance with the description of FIG. 2 to obtain the relationship between the voltage V of the storage battery 10 and the differential capacity characteristic dQ/dV under each SOH condition.

In step 430, the learning unit 170 determines a winning module based on the relationship between the voltage V of the storage battery 10 and the differential capacity characteristic dQ/dV under one SOH condition (for example, the SOH=64%) among different SOH conditions. For example, the learning unit 170 inputs the vector of the voltage V, where the SOH=64% as training data into each module to obtain each output of differential capacity characteristic dQ/dV value vectors computed by a neural net of each module. Then, the learning unit 170 computes Euclidean distance regarding each module between the computed differential capacity characteristic dQ/dV value vector and the differential capacity characteristic dQ/dV value vector, where the SOH=64%, which is training data. Then, the learning unit 170 determines the module having the smallest Euclidean distance to be the winning module.

In step 440, the learning unit 170 learns each module 310 based on the distance to the winning module determined in step 430 on the map. The learning unit 170, for example, most strongly learns the module determined to be the winning module among the plurality of modules 310 to make its differential capacity characteristic dQ/dV closer to the differential capacity characteristic dQ/dV of training data and learns poorly a module as the position on the map is farther from the winning module.

In step 450, learning unit 170 determines whether other training data exist. If other training data are determined to exist, the learning unit 170 brings the process back to step 430, determines the next winning module using training data under the next SOH condition (for example, the SOH=69%), and learns each module. In this manner, the learning unit 170 repeats the process until no other training data is left, that is when the it learns each module using training data, where the SOH=64%, 69%, 86%, 92%, and 100%.

When no other training data is determined to be left in step 450, the learning unit 170 associates the maximum capacity of the storage battery 10 with each condition individually, in step 460. That is, the maximum capacity of the storage battery 10 is associated with each module 310 individually. Here, the learning unit 170 calculates the maximum capacity of the storage battery 10 associated with each condition based on the integration characteristic, calculated by integrating the differential capacity characteristic dQ/dV by the voltage V of the storage battery 10. Specifically, the learning unit 170 may calculates the maximum capacity of the storage battery 10 associated with each condition based on the following formula. Herein, in the formula [Expression 1], $Q_{max}$ refers to the maximum capacity of the storage battery 10, Upper V refers to an upper limit voltage, which regulates the maximum capacity of the storage battery 10, and Lower V refers to a lower limit voltage, which regulates the maximum capacity of the storage battery 10. That is, the learning unit 170 calculates an area value regarding the differential capacity characteristic dQ/dV of each module in the range from the lower limit voltage to the upper limit voltage, which regulates the maximum capacity of the storage battery 10 to associate the area value with each module. Then, the learning unit 170 ends the flow process described in the present drawing.

$$Q_{max} = \int_{Lower\ V}^{Upper\ V} \left(\frac{dQ}{dV}\right)_{Module} dV \qquad [\text{Expression 1}]$$

Figure 5:
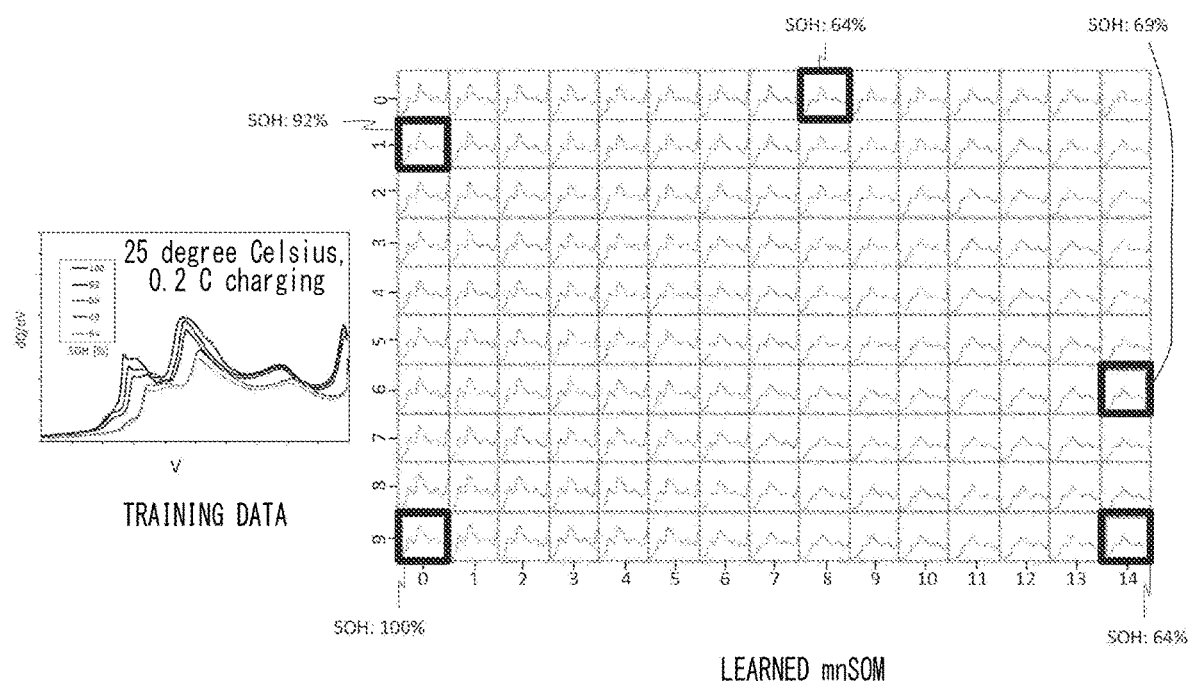
FIG. 5 shows a learned mnSOM learned in accordance with the flow of FIG. 4.

FIG. 5 shows the learned mnSOM learned in accordance with the flow in FIG. 4. As shown in the present drawing, for example, in the case of the learning using training data, where the SOH=100%, the module at a left bottom end on the map, which is module (0, 9), is determined to be the winning module, and the differential capacity characteristic dQ/dV of module (0, 9) is learned to become closest to the differential capacity characteristic dQ/dV, where the SOH=100%. Also, for example, in the case of the learning using training data, where the SOH=64%, the module at a right bottom end on the map, which is module (14, 9), is determined to be the winning module, and the differential capacity characteristic dQ/dV of module (14, 9) is learned to become closest to the differential capacity characteristic dQ/dV where, the SOH=64%. Herein, the learning unit 170 acquires 10×15=150 functions as shown in the present drawing by learning modules despite the fact that only five SOH conditions are used as training data, and self-organizingly arranges functions having a similar characteristic close to each other.

In this manner, because the learning unit 170 of the learning apparatus 100 according to the present embodiment generates the estimation model 300 using the mnSOM in accordance with the flow in FIG. 4, while supervised learning using training data is performed for the module determined to be the winning module, as a whole network, the self organized clustering can be performed by unsupervised learning. Therefore, the learning unit 170 can generate an estimation model using a relatively small amount of training data, which enables saving time and cost for prior preparation before generating a model. Also, because the learning unit 170 generates the estimation model based on data of the storage battery 10 in operation, it can generate the model without using detail information such as a physical property value unique to an electrode material of the storage battery 10 and the reaction principle of a battery.

Figure 6:
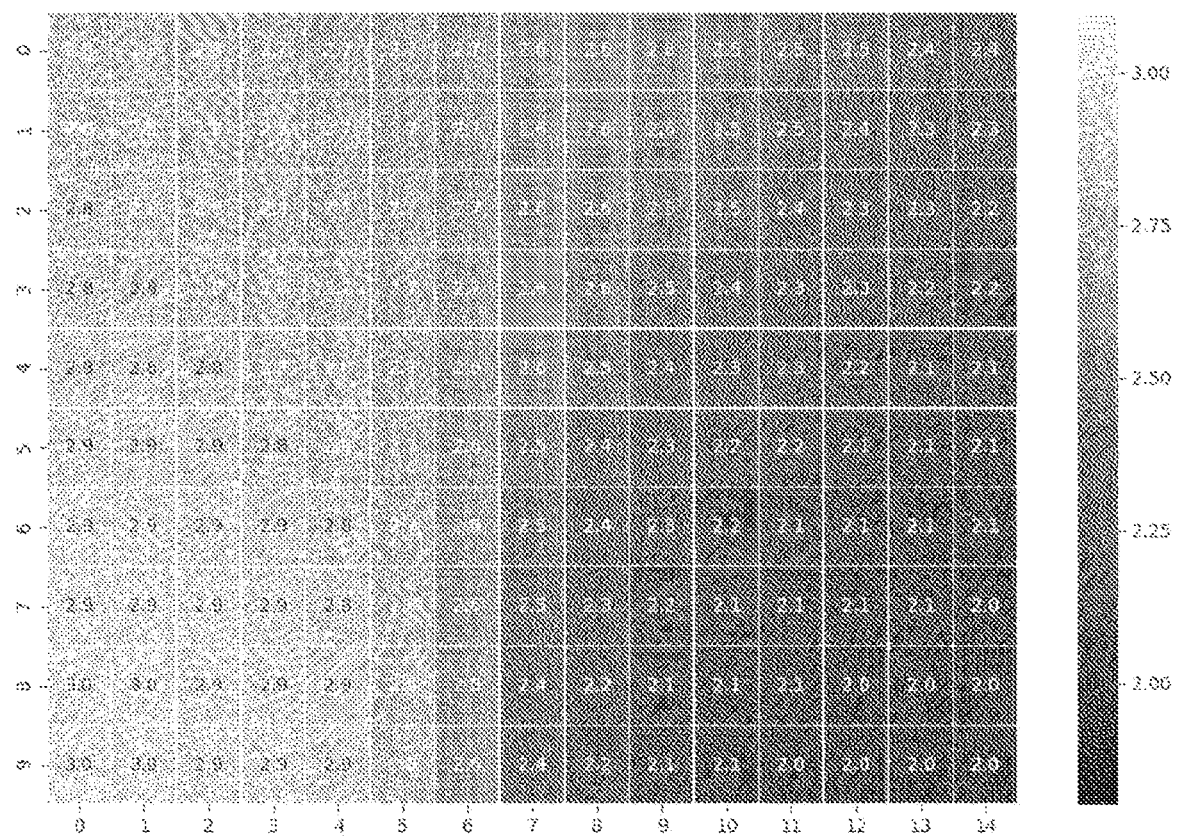
FIG. 6 shows an example of maximum capacities of the storage battery 10 associated with each module of the mnSOM by the learning apparatus 100 according to the present embodiment.

FIG. 6 shows an example of maximum capacities of the storage battery 10 associated with each module of the mnSOM by the learning apparatus 100 according to the present embodiment. In the present drawing, the value described in each module refers to the maximum capacity of the storage battery 10 associate with each module, and the present drawing expresses the magnitude of the maximum capacity by shading each module. The learning unit 170 calculates the maximum capacities of the storage battery 10 by integrating the function for each module shown in FIG. 5 by the voltage V of the storage battery 10 based on the above-mentioned formula [Expression 1], and associates each of them with each module.

In this manner, the learning unit 170 of the learning apparatus 100 according to the present embodiment associates the maximum capacity of the storage battery 10 with each module and, therefore, can provide the estimation model 300 described below, which makes estimating the maximum capacity of the storage battery 10 easy.

Note that, in the above-mentioned description, a case where the learning apparatus 100 generates the estimation model by learning the differential capacity characteristic dQ/dV calculated by differentiating the capacity Q by the voltage V of the storage battery 10 is described as one example, which is not limited thereto. The learning apparatus 100 may generate the estimation model by learning the differential voltage characteristic dV/dQ calculated by differentiating the voltage V by the capacity Q of the storage battery 10. That is, the calculation unit 150 may calculate the differential voltage characteristic dV/dQ calculated by differentiating the voltage V by the capacity Q of the storage battery 10 as the characteristic corresponding to the capacity change and the voltage change of the storage battery 10, and the learning unit 170 may generate the estimation model 300 by learning each module 310 with the capacity Q of the storage battery 10 as the input vector and the differential voltage characteristic dV/dQ of the storage battery 10 as the output vector.

Also, in the above-mentioned description, a case where the learning apparatus 100 generates the estimation model 300 using data actually acquired from the storage battery 10 as training data is described as one example, which is not limited thereto. The learning apparatus 100 may generate the estimation model 300 using an output of a numerical simulation model simulating the behavior of the storage battery 10 as training data.

Figure 7:
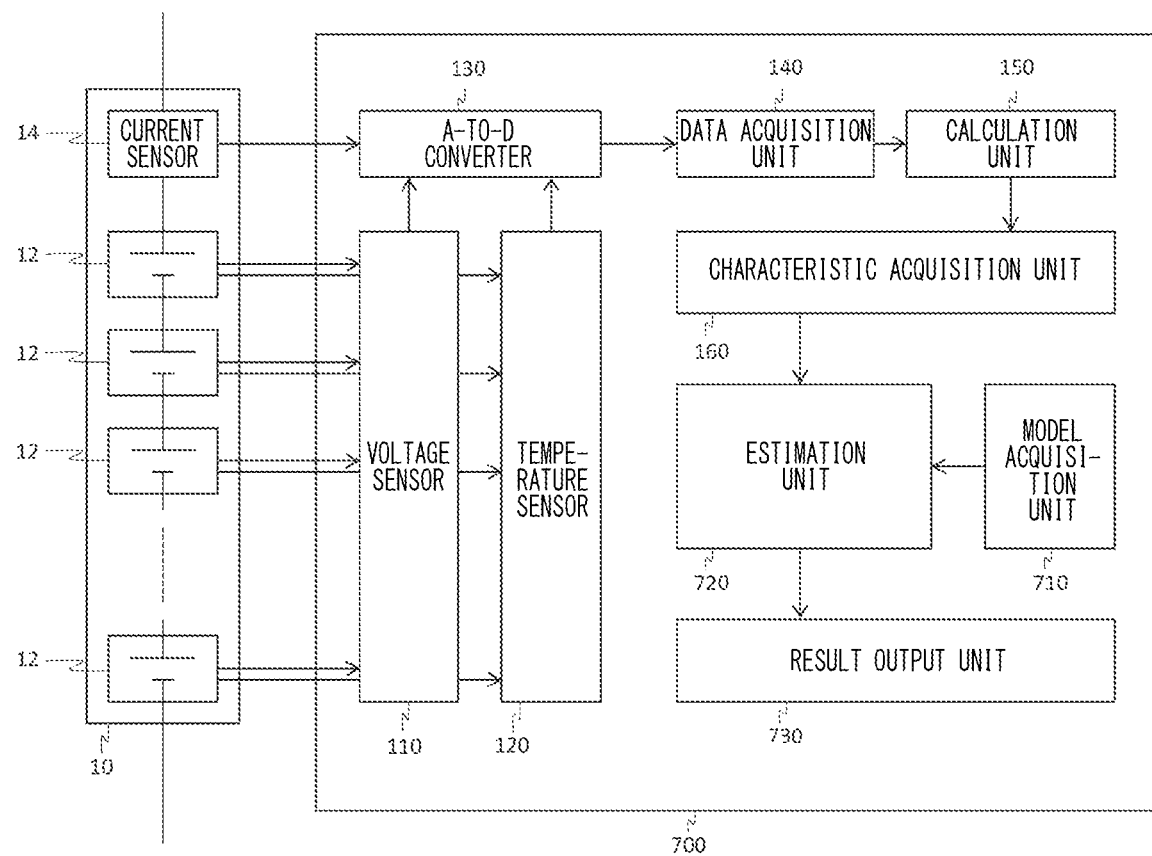
FIG. 7 shows an estimation apparatus 700 according to the present embodiment with the storage battery 10.

FIG. 7 shows an estimation apparatus 700 according to the present embodiment with the storage battery 10. In FIG. 7, components having the same function and configuration as in FIG. 1 are given the same reference numerals, and the following describes only differing points. The estimation apparatus 700 according to the present embodiment acquires the estimation model 300 and uses the acquired estimation model 300 to estimate at least one of the maximum capacity and the remaining capacity of the storage battery 10.

The estimation apparatus 700 may be configured as the same apparatus as the learning apparatus 100 shown in FIG. 1 and may be configured as a different apparatus from the learning apparatus 100. The estimation apparatus 700 may be a computer, such as a PC (a personal computer), a tablet computer, a smartphone, a workstation, a server computer or a general purpose computer, and may be a computer system to which a plurality of computers is connected. Such a computer system is also a computer in a broad sense. Also, the estimation apparatus 700 may be implemented by one or more virtual computer environments which can be executed in a computer. Alternately, the estimation apparatus 700 may be a special purpose computer designed for estimating at least one of the maximum capacity and the remaining capacity, and may be a special purpose hardware realized by a dedicated circuit.

The estimation apparatus 700 according to the present embodiment comprises a voltage sensor 110, a temperature sensor 120, an A-to-D converter 130, a data acquisition unit 140, a calculation unit 150, a characteristic acquisition unit 160, a model acquisition unit 710, an estimation unit 720, and a result output unit 730. A voltage sensor 110, a temperature sensor 120, an A-to-D converter 130, a data acquisition unit 140, a calculation unit 150 and a characteristic acquisition unit 160 are similar to those shown in FIG. 1, and therefore, descriptions of those are omitted.

The model acquisition unit 710 acquires an estimation model, which estimates at least one of the maximum capacity and the remaining capacity of the storage battery 10, from the relationship between one of the voltage V and the capacity Q of the storage battery 10 under the plurality of conditions and the characteristic corresponding to the capacity change and the voltage change of the storage battery 10 during at least one of charging and discharging of the storage battery 10. The model acquisition unit 710, for example, acquires the learned mnSOM with which the maximum capacities are associated by the learning apparatus 100 shown in FIG. 1 via a network or the like.

The estimation unit 720 uses the estimation model 300 acquired by the model acquisition unit 710 to estimate at least one of the maximum capacity and the remaining capacity of the storage battery 10 from one of the voltage V and the capacity Q of the storage battery 10 in operation and from the calculated characteristic corresponding to the capacity change and the voltage change of the storage battery 10. Here, the estimation unit 720 may judge whether it can estimate at least one of the maximum capacity and the remaining capacity of the storage battery 10 based on the time series data regarding the voltage V and the current I of the storage battery 10 in operation. Also, the estimation unit 720 may use the estimated maximum capacity and remaining capacity of the storage battery 10 to estimate the SOH and a SOC (State of Charge) of the storage battery 10. Note that, the SOC refers to a percentage of the remaining capacity to the maximum capacity of the storage battery 10 at a present time. Various types of the estimation in the estimation unit 720 will be described below. The estimation unit 720 supplies the estimated result to the result output unit 730.

The result output unit 730 supplies at least any one of the maximum capacity, the remaining capacity, the SOH and the SOC of the storage battery 10 estimated by the estimation unit 720 to another function unit or another apparatus. The result output unit 730, for example, may output these estimated results estimated by the estimation unit 720 when receiving an inquiry about the state of the storage battery 10 from a battery control system.

Figure 8:
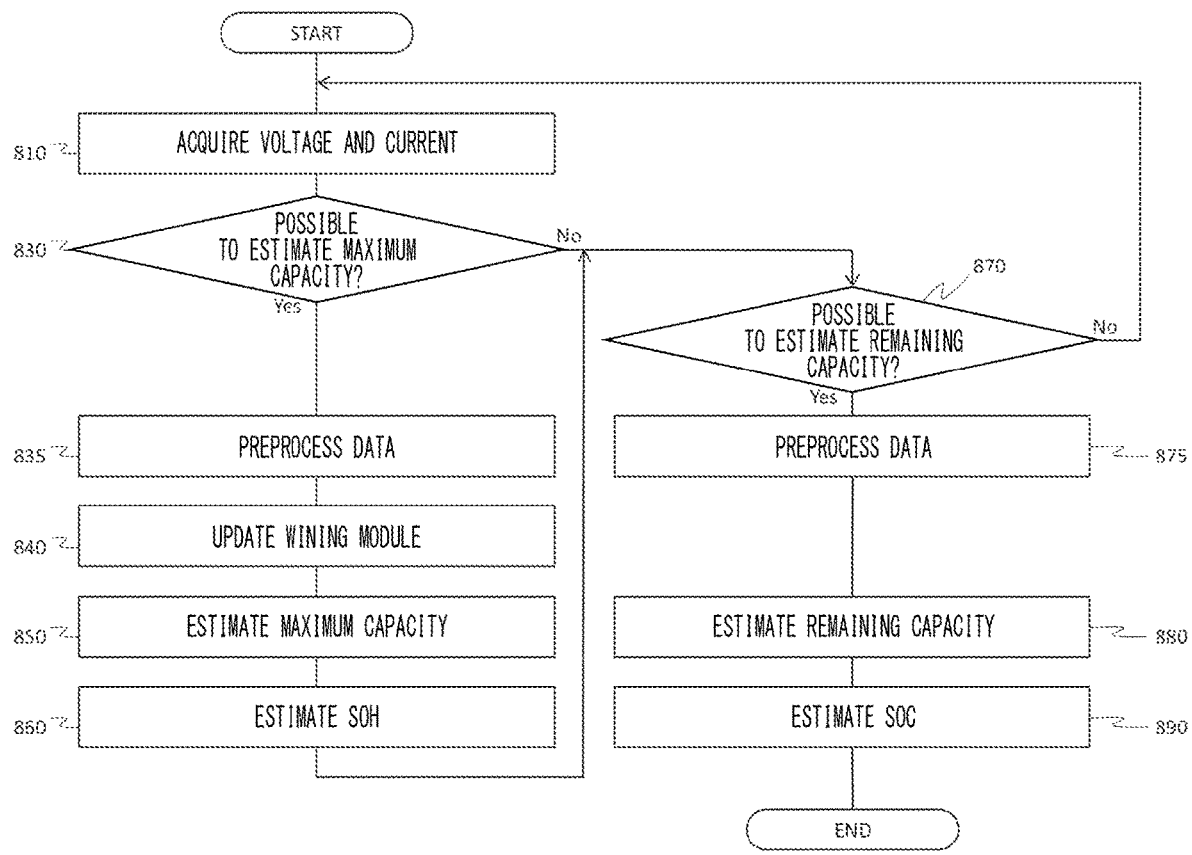
FIG. 8 shows a flow of estimating a state of the storage battery 10, by the estimation apparatus 700 of the present embodiment.

FIG. 8 shows a flow of estimating the state of the storage battery 10, by the estimation apparatus 700 of the present embodiment. In step 810, the data acquisition unit 140 acquires the time series data of the voltage V and the current I of the storage battery 10 in operation. Also, the data acquisition unit 140 acquires the temperature T of the storage battery 10 with the time series data of the voltage V and the current I of the storage battery 10.

In step 830, the estimation unit 720 judges whether it can estimate the maximum capacity of the storage battery 10 based on the time series data of the voltage V and the current I of the storage battery 10. The estimation unit 720, for example, judges whether the estimation of the maximum capacity of the storage battery 10 is possible according to whether appropriate data for estimating the maximum capacity are accumulated, for example, whether data in a region sensitive to the change in the SOH is accumulated. Also, the estimation unit 720 judges whether the estimation of the maximum capacity of the storage battery 10 is possible according to whether a sufficient amount of data so as to estimate the maximum capacity are accumulated, for example, whether data with the capacity range equivalent to the predetermined SOC range (such as the equivalent of SOC:20%) are accumulated. Additionally, the estimation unit 720 judges whether the estimation of the maximum capacity of the storage battery 10 is possible according to whether a feature point advantageous for the estimation of the maximum capacity is captured, for example, whether a peak point of the differential capacity characteristic dQ/dV is captured. If all of them are satisfied, the estimation unit 720 may judge that the estimation of the maximum capacity of the storage battery 10 is possible. Alternately, the estimation unit 720 may judge that the estimation of the maximum capacity of the storage battery 10 is possible if at least one of them is satisfied.

In step 830, if the estimation of the maximum capacity is judged as possible, in step 835, the calculation unit 150 performs preprocessing on data according to the description of FIG. 2 in the same manner with step 420. Then, the characteristic acquisition unit 160 accumulates the relationship between the voltage V of the storage battery 10 in operation and the differential capacity characteristic dQ/dV equivalent to for a certain period of time in a database or the like, which is not illustrated in the drawing.

Then, in step 840, the winning module is determined from the accumulated relationship between the voltage V of the storage battery 10 and the differential capacity characteristic dQ/dV, and the winning module is updated. Note that, initially, optional any one of modules may be set as the winning module. The estimation unit 720 selects a map of the mnSOM corresponding to a condition in operation among the plurality of maps. The estimation unit 720, for example, selects a map of the mnSOM corresponding to a temperature condition and a condition of charge/discharge rate in operation. Next, the estimation unit 720 inputs the accumulated vector of the voltage V into each module of the selected mnSOM to receive each output of the differential capacity characteristic dQ/dV value vector computed by the neural net of each module. Then, the estimation unit 720 computes Euclidean distance between the computed differential capacity characteristic dQ/dV value vector and the accumulated differential capacity characteristic dQ/dV value vector of each module. Finally, the estimation unit 720 determines module with the smallest Euclidean distance to be the winning module.

In step 850, the estimation unit 720 estimate the maximum capacity of the storage battery 10 based on the integration characteristic, calculated by integrating the differential capacity characteristic dQ/dV by the voltage V of the storage battery 10 of the module determined to be the winning module. When, for example, in the estimation model 300 acquired by model acquisition unit 710, the maximum capacity of the storage battery 10 is associated with each module in advance, the estimation unit 720 may summon the maximum capacity associated with the module determined to be the winning module to use it as the estimate of the maximum capacity of the storage battery 10. When in the estimation model 300 the maximum capacity of the storage battery 10 is not associated with each module for example, the estimation unit 720 may calculate the maximum capacity based on the above-mentioned formula [Expression 1] to estimate it to be maximum capacity of the storage battery 10. The estimation apparatus 700 memorizes the maximum capacity of the storage battery 10 estimate in this manner as the latest maximum capacity estimation value. Thereby, the result output unit 730 can supply the maximum capacity estimation value when receiving an inquiry about the maximum capacity value from another function unit or another apparatus.

In step 860, the estimation unit 720 uses the maximum capacity estimation value estimated in step 850 to estimate the SOH of the storage battery 10. The estimation unit 720, for example, may indicate a value represented by a percentage calculated by dividing the maximum capacity estimation value by the initial maximum capacity, which is the maximum capacity wherein the SOH=100%, to estimate the SOH of the storage battery 10. The estimation apparatus 700 memorizes the SOH of the storage battery 10 estimated in this manner as the latest SOH estimated value. Thereby, the result output unit 730 can supply the SOH estimated value when receiving an inquiry about the SOH from another function unit or another apparatus.

Note that, in the above-mentioned description, a case where the estimation apparatus 700 estimates both the maximum capacity and the SOH of the storage battery 10 is described as one example, which is not limited thereto. When the estimation of the SOH is unnecessary, the estimation apparatus 700 may omit the process of step 860. Additionally, when the maximum capacity and the estimation of the SOH are unnecessary, the estimation apparatus 700 may omit the process performed between step 830 and step 860. Thereby, the estimation apparatus 700 can omit an unnecessary state estimation to reduce the computational load.

In step 870, the estimation unit 720 judges whether it can estimate the remaining capacity of the storage battery 10 based on the time series data of the voltage V and the current I of the storage battery 10. The estimation unit 720, for example, judges whether the estimation of the remaining capacity of the storage battery 10 is possible according to whether data in an appropriate region for estimating the remaining capacity are accumulated, for example, whether a region where the change with respect to the SOC is large is accumulated. Also, the estimation unit 720 judges whether the estimation of the remaining capacity of the storage battery 10 is possible according to whether a sufficient amount of data so as to estimate the remaining capacity are accumulated, for example, whether data with the capacity range equivalent to the predetermined SOC range (such as the equivalent of SOC:20%) are accumulated. Additionally, the estimation unit 720 judges whether the estimation of the remaining capacity of the storage battery 10 is possible according to whether a feature point advantageous for estimating the remaining capacity is captured, for example, whether a peak point of the differential capacity characteristic dQ/dV is captured. If all of them are satisfied, the estimation unit 720 may judge that the estimation of the remaining capacity of the storage battery 10 is possible. Alternately, the estimation unit 720 may judge that the estimation of the remaining capacity of the storage battery 10 is possible if at least one of them is satisfied.

If the estimation of the remaining capacity is judged as possible in step 870, the estimation apparatus 700 performs preprocessing on data in step 875, and the estimation unit 720 acquires a partial differential voltage characteristic dV/dQ calculated by differentiating the voltage V by the capacity Q of the storage battery 10 in operation based on the time series data of the voltage V and the current I of the storage battery 10. Here, for example, the calculation unit 150 may perform data smoothing and calculate the capacity Q based on the time series data of the voltage V and the current I of the storage battery 10 in operation similarly to the left drawing and the center drawing of FIG. 2, and then differentiates the voltage V by the capacity Q to convert into the differential voltage characteristic dV/dQ [V/Ah] calculated by differentiating the voltage V by the capacity Q of the storage battery 10 and supply it to the estimation unit 720. Alternately, for example, in step 875 after being judged that the estimation of the maximum capacity is possible in step 830, which means after the preprocessing of data in step 835, the estimation unit 720 may acquire the partial differential voltage characteristic dV/dQ by converting the differential capacity characteristic dQ/dV of the storage battery 10, which was acquired in step 835, into the differential voltage characteristic dV/dQ calculated by differentiating the voltage V by the capacity Q of the storage battery 10.

Then, the estimation unit 720 acquires a model differential voltage characteristic dV/dQ calculated by differentiating the voltage V of the storage battery 10 by the capacity Q from the estimation model 300 in step 880 to estimate the remaining capacity of the storage battery 10 with reference to the model differential voltage characteristic dV/dQ. For example, the estimation unit 720 converts the differential capacity characteristic dQ/dV of the module determined to be the winning module in step 840 into the model differential voltage characteristic dV/dQ calculated by differentiating the voltage V of the storage battery 10 by the capacity Q to use the model differential voltage characteristic dV/dQ as a reference.

The estimation unit 720 performs fitting on a partial differential voltage characteristic dV/dQ calculated by differentiating a voltage V of the storage battery 10 in operation by a capacity Q based on a time series data of a voltage V and a current I of the storage battery 10 with reference to the model differential voltage characteristic dV/dQ to estimate a remaining capacity of the storage battery 10. This will be described below. Note that, if the estimation of the maximum capacity is judged as impossible in step 830, the estimation unit 720 may use the winning module of the previous maximum capacity estimation to estimate the remaining capacity. Also, in the case of omitting the process performed between step 830 and step 860 as mentioned above, the estimation unit 720 may use the winning module of the previous maximum capacity estimation or a module which is set as the winning module in advance to estimate the remaining capacity. The estimation apparatus 700 memorizes the remaining capacity of the storage battery 10 estimated in this manner as the latest remaining capacity estimation value. Thereby, the result output unit 730 can supply the remaining capacity estimation value when receiving an inquiry about the remaining capacity value from another function unit or another apparatus.

In step 890, the estimation unit 720 uses the remaining capacity estimation value estimated in step 880 to estimate the SOC of the storage battery 10. The estimation unit 720, for example, may indicate a value represented percentage obtained by dividing the remaining capacity estimation value by the maximum capacity estimation value to estimate the SOC of the storage battery 10. The estimation apparatus 700 memorizes the SOC of the storage battery 10 estimated in this manner as the latest SOC estimated value. Thereby, the result output unit 730 can supply the SOC estimated value when receiving an inquiry about the SOC from another function unit or another apparatus.

Note that, in the above-mentioned description, a case where the estimation apparatus 700 estimates the remaining capacity and the SOC of the storage battery 10 is described as one example, which is not limited thereto. In the case that the estimation of the SOC is unnecessary, the estimation apparatus 700 may omit the process of step 890. Also, when the estimation of the remaining capacity and the SOC is unnecessary, the estimation apparatus 700 may omit the process performed between step 870 and step 890. Thereby, the estimation apparatus 700 can omit the unnecessary estimation of the state, which reduces the computational load.

Figure 9:
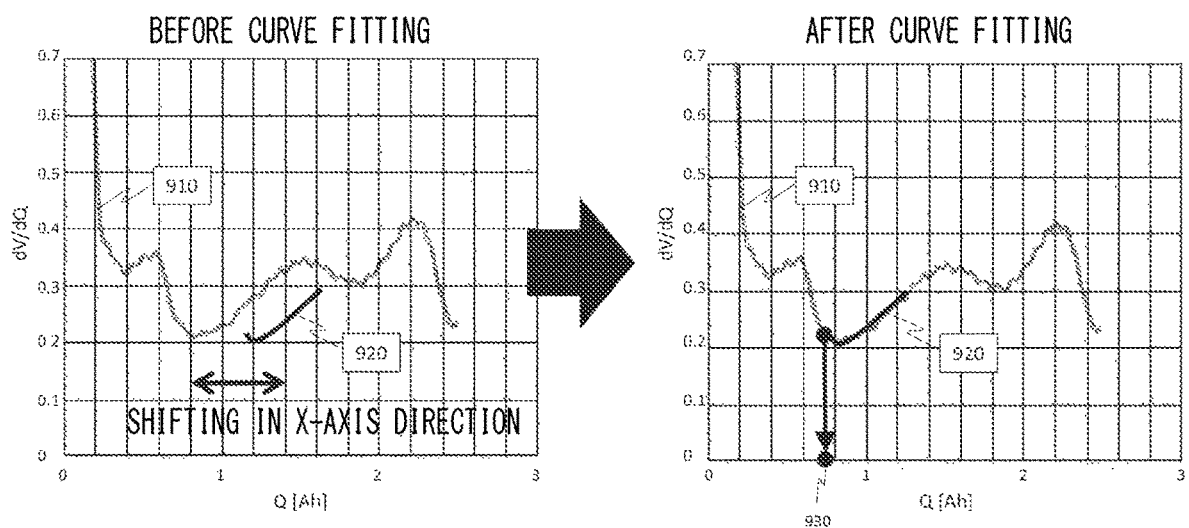
FIG. 9 shows one example of the curve fitting performed when the estimation apparatus 700 according to the present embodiment estimates the remaining capacity of the storage battery 10.

FIG. 9 shows one example of the curve fitting performed when the estimation apparatus 700 according to the present embodiment estimates the remaining capacity of the storage battery 10. The left of this drawing shows the model differential voltage characteristic dV/dQ and the partial differential voltage characteristic dV/dQ before the curve fitting. In the present drawing, the model differential voltage characteristic dV/dQ is shown as a waveform 910. Also, the partial differential voltage characteristic dV/dQ is shown as a waveform 920.

In this state, the estimation unit 720 performs fitting on the partial differential voltage characteristic dV/dQ with reference to the model differential voltage characteristic dV/dQ to estimate the remaining capacity. Specifically, the estimation unit 720 shifts the waveform 920 showing the partial differential voltage characteristic dV/dQ in a horizontal axis direction (the X-axis direction) so that it fits the waveform 910 showing the model differential voltage characteristic dV/dQ.

The right of this drawing shows the model differential voltage characteristic dV/dQ and the partial differential voltage characteristic dV/dQ after the curve fitting. The estimation unit 720 estimates the remaining capacity of the storage battery 10 based on the partial differential voltage characteristic dV/dQ after the curve fitting in this manner. The estimation unit 720, for example, estimates the remaining capacity of the storage battery 10 at the X axis value of the partial differential voltage characteristic dV/dQ after the curve fitting (as one example, the X axis value of the left end of the waveform 920).

In this manner, the estimation apparatus 700 of the present embodiment uses the acquired estimation model 300 to estimate at least one of the maximum capacity and the remaining capacity of the storage battery 10 from the voltage of the storage battery 10 in operation and the characteristic corresponding to the capacity change and the voltage change of the storage battery 10. Thereby, the estimation apparatus 700 according to the present embodiment can to estimate at least one of the maximum capacity and the remaining capacity of the storage battery 10 without using detail information such as a physical property value unique to an electrode material of the storage battery 10 and the reaction principle of a battery.

Note that, in the above-mentioned description, a case where the process of the estimation apparatus 700, when the estimation model 300 is a model generated by learning each module 310 with the output vector of the differential capacity characteristic dQ/dV, is described as one example, but it is not limited thereto. If the estimation model 300 is the model generated by learning each module 310 with the output vector of the differential voltage characteristic dV/dQ, the estimation apparatus 700 may determine the winning module of the storage battery 10 with input vector of the capacity Q of the storage battery 10 and with the output vector of the differential voltage characteristic dV/dQ of the storage battery 10 to estimate the maximum capacity and the remaining capacity.

Figure 10:
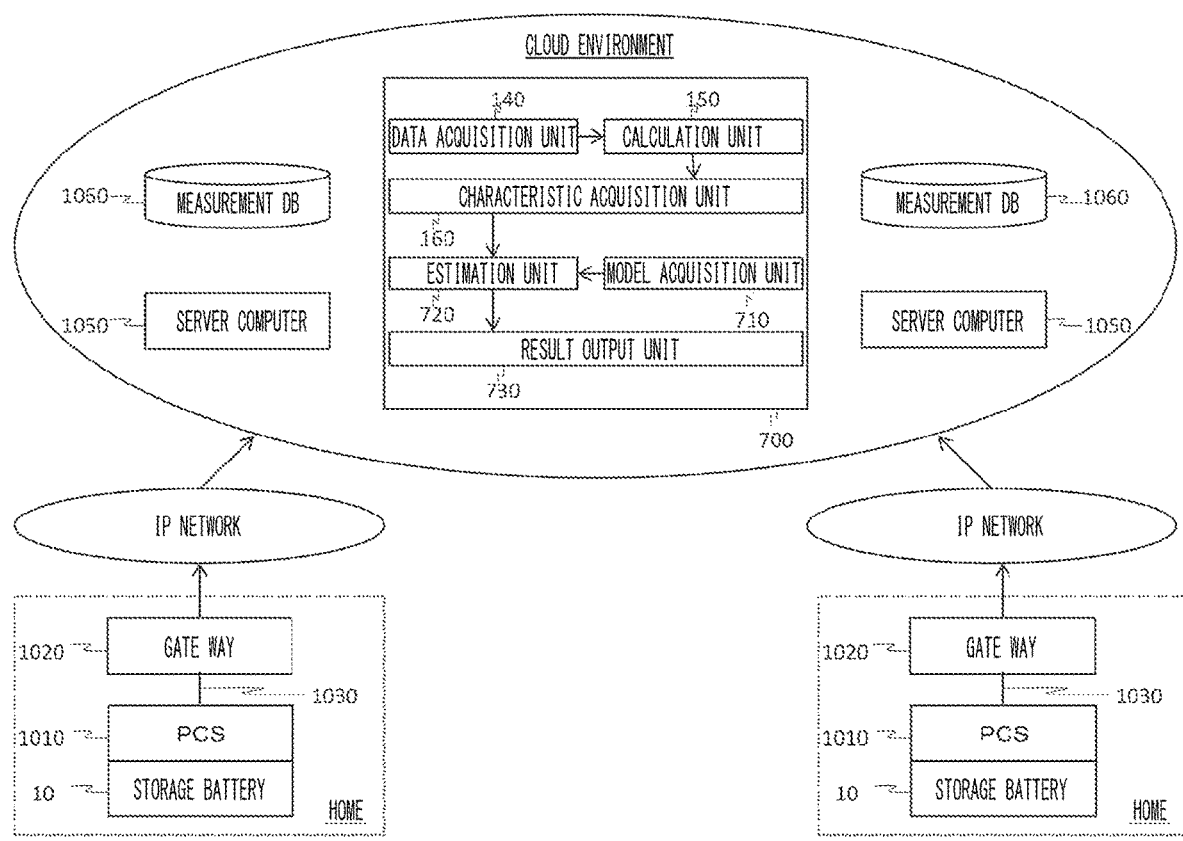
FIG. 10 shows an example of realizing the estimation apparatus 700 according to the modified example of the present embodiment by cloud computing.

FIG. 10 shows an example of realizing the estimation apparatus 700 according to the modified example of the present embodiment by cloud computing. The present drawing describes one example of a case of acquiring data of each storage battery 10 in operation of a large number of small-scale virtual power plants which are distributed to each home, such as VPP (Virtual Power Plant), to provide the state of each storage battery 10 for an aggregator which comprehensively controls the VPP.

In the present drawing, the storage battery 10, a power conditioning sub-system 1010, a gateway 1020 and a home network 1030 are provided for each home. The power conditioning sub-system 1010 mainly has a function for converting AC power of power network into DC power to charge the storage battery 10, a function for converting the AC power of the storage battery 10 to the DC power to supply it for equipment of each home, a function for monitoring the state of the storage battery 10 to safely control the storage battery 10 and a function for providing information about the storage battery 10 upward.

The gateway 1020 is a network node for connecting a computer network to a network using a different protocol. The gateway 1020 is connected with the power conditioning sub-system 1010 via the home network 1030.

The home network 1030 connects the power conditioning sub-system 1010 and the gateway 1020. The representative communication protocol of home network 1030 is ECHONET Lite (registered trademark). ECHONET Lite is communication specifications designed to transform resource saving machinery such as sensors, white goods and equipment into "IoT" devices to realize services, such as energy management and remote maintenance. Accordingly, the gateway 1020 supplies various types of data provided by the power conditioning sub-system 1010 via such communication specifications for a cloud environment via an IP network. Also, the gateway 1020 supplies various types of data acquired from the cloud environment via the IP network for the power conditioning sub-system 1010 via the home network.

In the cloud environment, the estimation apparatus 700 according to the present embodiment, a server computer 1050 and a measurement database 1060 are provided.

The server computer 1050 provides various kinds of services for a client have access to the cloud environment. The server computer 1050, for example, may be a cloud server for cloud computing, or may be an edge server for edge computing. The server computer 1050 of the present drawing acquires various types of data kept by the power conditioning sub-system 1010 including the voltage and the current of the storage battery 10 via the gateway 1020 and the IP network and supplies the acquired various types of data to the measurement database 1060.

The measurement database 1060 accumulates the various types of data supplied by the server computer 1050. Then, it supplies the accumulated various types of data to the estimation apparatus 700.

The data acquisition unit 140 of the estimation apparatus 700 of this modified example acquires various types of data needed for the estimation of the maximum capacity and the remaining capacity of the storage battery 10 from the measurement database 1060. Then, the estimated state of each storage battery 10 is provided for an aggregator of a VPP and the like. In this modified example, because the cloud computing realizes the estimation apparatus 700 in this manner, services related to the capacity estimation of the storage battery 10 can be realized in various environments accessible to clouds.

Various embodiments of the present invention may be described with reference to flowcharts and block diagrams, and blocks in the flowcharts and the block diagrams may represent (1) steps of processes in which operations are performed or (2) sections of apparatuses responsible for performing operations. Certain steps and sections may be implemented by dedicated circuitry, programmable circuitry supplied with computer-readable instructions stored on computer-readable media, and/or processors supplied with computer-readable instructions stored on computer-readable media. Dedicated circuitry may include digital and/or analog hardware circuits and may include integrated circuits (IC) and/or discrete circuits. Programmable circuitry may include reconfigurable hardware circuits comprising logical AND, OR, XOR, NAND, NOR, and other logical operations, flip-flops, registers, memory elements, etc., such as field-programmable gate arrays (FPGA), programmable logic arrays (PLA), etc.

Computer-readable media may include any tangible device that can store instructions for execution by a suitable device. As a result, the computer-readable medium having instructions stored in the tangible device comprises an article of manufacture including instructions which can be executed to create means for performing operations specified in the flowcharts or block diagrams. Examples of computer-readable media may include an electronic storage medium, a magnetic storage medium, an optical storage medium, an electromagnetic storage medium, a semiconductor storage medium, etc. More specific examples of computer-readable media may include a floppy (registered trademark) disk, a diskette, a hard disk, a random access memory (RAM), a read-only memory (ROM), an erasable programmable read-only memory (EPROM or Flash memory), an electrically erasable programmable read-only memory (EEPROM), a static random access memory (SRAM), a compact disc read-only memory (CD-ROM), a digital versatile disk (DVD), a Blu-ray(registered trademark) disc, a memory stick, an integrated circuit card, etc.

Computer-readable instructions may include assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk(registered trademark), JAVA(registered trademark), C++, etc., and conventional procedural programming languages, such as the "C" programming language or similar programming languages.

Computer-readable instructions may be provided to a processor of a general-purpose computer, special purpose computer, or other programmable data processing apparatus, or to programmable circuitry, locally or via a local area network (LAN), wide area network (WAN) such as the Internet, etc., so that the computer-readable instructions is executed to create means for performing operations specified in the flowcharts or block diagrams. Examples of processors include computer processors, processing units, microprocessors, digital signal processors, controllers, microcontrollers, etc.

Figure 11:
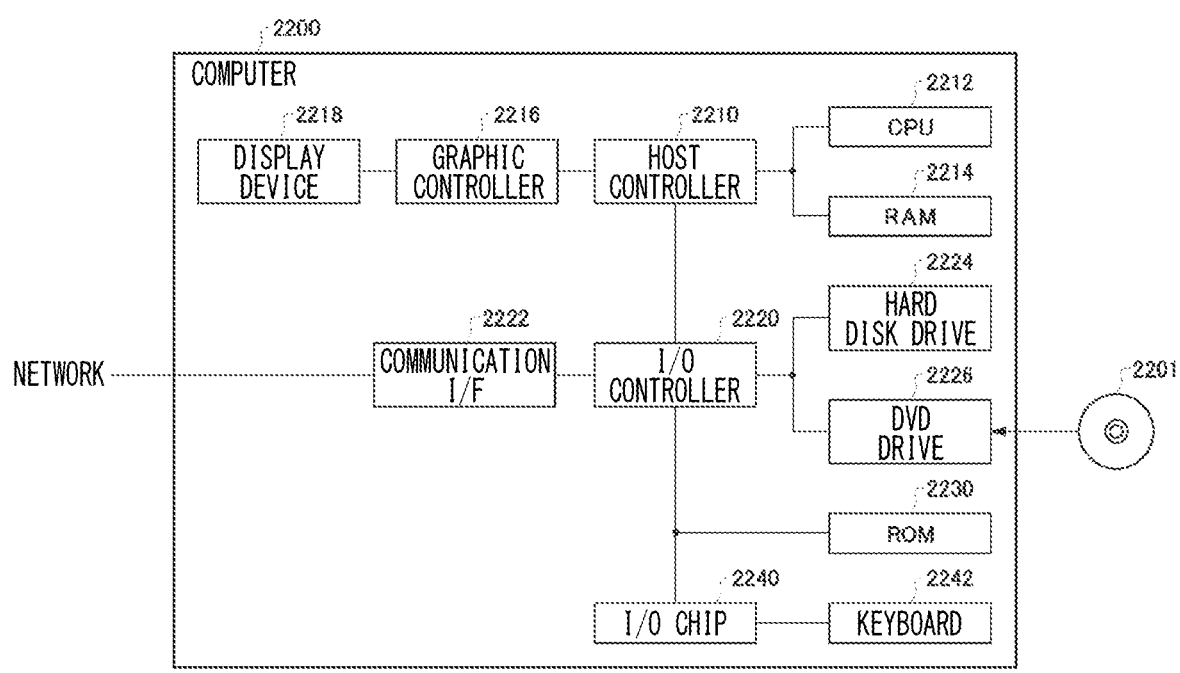
FIG. 11 shows an example of a computer 2200 in which a plurality of aspects of the present invention may be embodied entirely or partially.

FIG. 11 shows an example of a computer 2200 in which a plurality of aspects of the present invention may be embodied entirely or partially. A program that is installed in the computer 2200 can cause the computer 2200 to function for operations associated with an apparatus according to the embodiment of the present invention or as one or more sections in the apparatus, or cause the computer 2200 to perform the operations or the one or more sections thereof, and/or cause the computer 2200 to perform processes of the embodiment of the present invention or steps thereof. Such a program may be performed by a CPU 2212 so as to cause the computer 2200 to perform certain operations associated with some or all of the blocks of flowcharts and block diagrams described herein.

The computer 2200 according to the present embodiment includes the CPU 2212, a RAM 2214, a graphics controller 2216, and a display device 2218, which are interconnected by a host controller 2210. The computer 2200 also includes a communication interface 2222, a hard disk drive 2224, a DVD-ROM drive 2226, and an input/output unit such as an IC card drive, which are connected to the host controller 2210 via an input/output controller 2220. The computer also includes a ROM 2230 and a legacy input/output unit such as a keyboard 2242, which are connected to the input/output controller 2220 via an input/output chip 2240.

The CPU 2212 operates according to the programs stored in the ROM 2230 and the RAM 2214, thereby controlling each unit. The graphics controller 2216 acquires image data which is generated, by the CPU 2212, in a frame buffer or the like provided in the RAM 2214 or in itself so as to cause the image data to be displayed on the display device 2218.

The communication interface 2222 communicates with another electronic device via the network. The hard disk drive 2224 stores the program and data used by the CPU 2212 in the computer 2200. The DVD-ROM drive 2226 reads the program or the data from a DVD-ROM 2201, and provides the program or the data to the hard disk drive 2224 via the RAM 2214. The IC card drive reads the program and data from an IC card, and/or writes the program and data to the IC card.

The ROM 2230 stores, in itself, a boot program or the like that is executed by the computer 2200 during activation, and/or a program that depends on hardware of the computer 2200. Further, the input/output chip 2240 may connect various input/output units to the input/output controller 2220 via a parallel port, serial port, keyboard port, mouse port, or the like.

The program is provided by a computer-readable medium such as the DVD-ROM 2201 or the IC card. The program is read from the computer-readable medium, installed in the hard disk drive 2224, the RAM 2214, or the ROM 2230, which is also an example of the computer-readable medium, and executed by the CPU 2212. Information processing written in these programs is read by the computer 2200, resulting in cooperation between a program and various types of hardware resources described above. An apparatus or a method may be constituted by realizing the operation or processing of information in accordance with the usage of the computer 2200.

For example, when a communication is executed between the computer 2200 and an external device, the CPU 2212 may execute a communication program loaded in the RAM 2214, and instruct the communication interface 2222 to process the communication based on the processing written in the communication program. Under the control of the CPU 2212, the communication interface 2222 reads transmission data stored in a transmission buffering region provided in a recording medium such as the RAM 2214, the hard disk drive 2224, the DVD-ROM 2201 or the IC card, transmits the read transmission data to the network, or writes received data which is received from the network to a reception buffering region or the like provided on the recording medium.

Further, the CPU 2212 may cause all or a necessary portion of a file or a database to be read into the RAM 2214, the file or the database having been stored in an external recording medium such as the hard disk drive 2224, the DVD-ROM drive 2226 (DVD-ROM 2201), the IC card, etc., and perform various types of processing on the data on the RAM 2214. Then, the CPU 2212 writes back the processed data to the external recording medium.

Various types of information such as various types of programs, data, tables, and databases may be stored in recording media to undergo information processing. The CPU 2212 may execute various types of processing on the data read from the RAM 2214 to write back a result to the RAM 2214, the processing being described throughout the present disclosure, specified by an instruction sequence of the programs, and including various types of operations, processing of information, condition determinations, conditional branch, unconditional branch, information retrievals/replacements, or the like. Further, the CPU 2212 may search for information in the file, the database, or the like in the recording medium. For example, when a plurality of entries each having an attribute value of a first attribute associated with an attribute value of a second attribute are stored in the recording medium, the CPU 2212 may search, from among the plurality of entries, for an entry matching a condition in which the attribute value of the first attribute is specified, and read the attribute value of the second attribute stored in the entry, thereby acquiring the attribute value of the second attribute associated with the first attribute that satisfies a predetermined condition.

The program or software module described above may be stored on the computer 2200 or in a computer-readable medium near the computer 2200. Further, a recording medium such as a hard disk or a RAM provided in a server system connected to a dedicated communication network or the Internet can be used as the computer-readable medium, thereby providing the program to the computer 2200 via the network.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10: storage battery
12: battery cell
14: current sensor
100: learning apparatus
110: voltage sensor
120: temperature sensor
130: A-to-D converter
140: data acquisition unit
150: calculation unit
160: characteristic acquisition unit
170: learning unit
180: model outputting unit
300: estimation model
310: module
700: estimation apparatus
710: model acquisition unit
720: estimation unit
730: result output unit
1010: power conditioning sub-system
1020: gateway
1030: home network
1050: server computer
1060: measurement database
2200: computer
2201: DVD-ROM
2210: host controller
2212: CPU
2214: RAM
2216: graphics controller
2218: display device
2220: input/output controller
2222: communication interface
2224: hard disk drive
2226: DVD-ROM drive
2230: ROM
2240: input/output chip
2242: keyboard

What is claimed is:

1. A learning apparatus comprising:
a characteristic acquisition unit for acquiring one of a voltage and a capacity of a storage battery and a characteristic corresponding to a capacity change and a voltage change of the storage battery under a plurality of conditions during at least one of charging and discharging of the storage battery; and
a learning unit for learning a relationship between one of the voltage and the capacity of the storage battery and the characteristic under each condition of the plurality of conditions to generate an estimation model for estimating at least one of a maximum capacity and a remaining capacity of the storage battery from one of the voltage and the capacity of the storage battery and the characteristic;
wherein the learning unit is configured to use a modular network Self Organizing Map, wherein a module is a neural network, to generate the estimation model.

2. The learning apparatus according to claim 1, wherein the learning unit is configured to generate the estimation model, which interpolates the relationship under a different condition from the relationship under at least one of the plurality of conditions.

3. The learning apparatus according to claim 1, wherein the characteristic is a differential capacity characteristic calculated by differentiating the capacity of the storage battery by the voltage.

4. The learning apparatus according to claim 3, wherein the learning unit is configured to associate the maximum capacity of the storage battery with each condition individually.

5. The learning apparatus according to claim 4, wherein the learning unit is configured to calculate the maximum capacity of the storage battery to associate with each condition based on an integration characteristic calculated by integrating the differential capacity characteristic by the voltage of the storage battery.

6. The learning apparatus according to claim 1, wherein the characteristic is a differential voltage characteristic calculated by differentiating the voltage of the storage battery by the capacity.

7. An estimation apparatus comprising:
a model acquisition unit for acquiring an estimation model for estimating at least one of a maximum capacity and a remaining capacity of a storage battery from a relationship between one of a voltage and a capacity of the storage battery and a characteristic corresponding to a capacity change and a voltage change of the storage battery under a plurality of conditions during at least one of charging and discharging of the storage battery;
a data acquisition unit for acquiring a time series data regarding the voltage and a current of the storage battery;
a calculation unit for calculating the characteristic based on the time series data regarding the voltage and the current of the storage battery; and
an estimation unit for using the estimation model to estimate at least one of the maximum capacity and the remaining capacity of the storage battery from one of the voltage and the capacity of the storage battery and the calculated characteristic;
wherein the estimation model is learned using a modular network Self Organizing Map, wherein a module is a neural network.

8. The estimation apparatus according to claim 7, wherein the estimation model is for interpolating the relationship under a different condition from the relationship under at least one of the plurality of conditions.

9. The estimation apparatus according to claim 7, wherein the characteristic is a differential capacity characteristic calculated by differentiating the capacity of the storage battery by the voltage.

10. The estimation apparatus according to claim 9, wherein the estimation unit is configured to estimate the maximum capacity of the storage battery based on an integration characteristic calculated by integrating the differential capacity characteristic by the voltage of the storage battery.

11. The estimation apparatus according to claim 7, wherein the characteristic is a differential voltage characteristic calculated by differentiating the voltage of the storage battery by the capacity.

12. The estimation apparatus according to claim 9, wherein the estimation unit is configured to acquire a model differential voltage characteristic calculated by differentiating the voltage of the storage battery by the capacity from the estimation model to estimate the remaining capacity of the storage battery with reference to the model differential voltage characteristic.

13. The estimation apparatus according to claim 12, wherein the estimation unit is configured to perform fitting on a partial differential voltage characteristic calculated by differentiating the voltage of the storage battery by the capacity based on the time series data of the voltage and the current of the storage battery with reference to the model differential voltage characteristic to estimate the remaining capacity of the storage battery.

14. The estimation apparatus according to claim 7, the estimation unit is configured to judge whether it can estimate at least one of the maximum capacity and the remaining capacity of the storage battery based on the time series data of the voltage and the current of the storage battery.

15. A learning method for a learning apparatus to learn comprising:
acquiring one of a voltage and a capacity of a storage battery and a characteristic corresponding to a capacity change and a voltage change of the storage battery under a plurality of conditions during at least one of charging and discharging of the storage battery; and
learning a relationship between one of the voltage and the capacity of the storage battery and the characteristic under each condition of the plurality of conditions to generate an estimation model for estimating at least one of a maximum capacity or a remaining capacity of the storage battery from one of the voltage and the capacity of the storage battery and the characteristic;
wherein the estimation model is learned using a modular network Self Organizing Map, wherein a module is a neural network.

16. An estimation method in which an estimation apparatus estimates comprising:
acquiring an estimation model for estimating at least one of a maximum capacity and a remaining capacity of a storage battery from a relationship between one of a voltage and a capacity of the storage battery and a characteristic corresponding to a capacity change and a voltage change of the storage battery under a plurality of conditions during at least one of charging and discharging of the storage battery;
acquiring a time series data of the voltage and a current of the storage battery;
calculating the characteristic based on the time series data of the voltage and the current of the storage battery; and
using the estimation model to estimate at least one of the maximum capacity and the remaining capacity of the storage battery from one of the voltage and the capacity of the storage battery and the calculated characteristic;
wherein the estimation model is learned using a modular network Self Organizing Map, wherein a module is a neural network.

17. A non-transitory recording medium having recorded thereon a learning program to be implemented by a computer for causing the computer to function as:
a characteristic acquisition unit for acquiring one of a voltage and a capacity of a storage battery and a characteristic corresponding to a capacity change and a voltage change of the storage battery under a plurality of conditions during at least one of charging and discharging of the storage battery;
a learning unit for learning a relationship between one of the voltage and the capacity of the storage battery and the characteristic under each of the plurality of conditions to generate an estimation model for estimating at least one of a maximum capacity and a remaining capacity of the storage battery from one of the voltage and the capacity of the storage battery and the characteristic;
wherein the estimation model is learned using a modular network Self Organizing Map, wherein a module is a neural network.

18. A non-transitory recording medium having recorded thereon an estimation program to be implemented by a computer for causing the computer to function as:
a model acquisition unit for acquiring an estimation model for estimating at least one of a maximum capacity and a remaining capacity of a storage battery from a relationship between one of a voltage and a capacity of the storage battery and a characteristic corresponding to a capacity change and a voltage change of the storage battery under a plurality of conditions during at least one of charging and discharging of the storage battery;
a data acquisition unit for acquiring a time series data regarding the voltage and a current of the storage battery;
a calculation unit for calculating the characteristic based on the time series data regarding the voltage and the current of the storage battery; and
an estimation unit for using the estimation model to estimate at least one of the maximum capacity and the remaining capacity of the storage battery from one of the voltage and the capacity of the storage battery and the calculated characteristic;
wherein the estimation model is learned using a modular network Self Organizing Map, wherein a module is a neural network.

* * * * *